US012604145B2

(12) United States Patent
 Zou et al.

(10) Patent No.:  US 12,604,145 B2
(45) Date of Patent:  Apr. 14, 2026

(54) MICRO-ELECTRO-MECHANICAL SYSTEM MICROPHONE, MICROPHONE UNIT AND ELECTRONIC DEVICE

(71) Applicant: GOERTEK MICROELECTRONICS INC., Shandong (CN)

(72) Inventors: Quanbo Zou, Shandong (CN); Guanxun Qiu, Shandong (CN); Zhe Wang, Shandong (CN); Qinglin Song, Shandong (CN)

(73) Assignee: Goertek Microelectronics Inc., Qingdao (CN)

( * ) Notice: Subject to any disclaimer, the term of this patent is extended or adjusted under 35 U.S.C. 154(b) by 50 days.

(21) Appl. No.: 18/293,513

(22) PCT Filed: Jul. 27, 2022

(86) PCT No.: PCT/CN2022/108092
 § 371 (c)(1),
 (2) Date: Jan. 30, 2024

(87) PCT Pub. No.: WO2023/005952
 PCT Pub. Date: Feb. 2, 2023

(65) Prior Publication Data
 US 2024/0334132 A1  Oct. 3, 2024

(30) Foreign Application Priority Data
 Jul. 30, 2021  (CN) .......................... 202110875302.3

(51) Int. Cl.
 *H04R 19/04* (2006.01)
 *B81B 3/00* (2006.01)
 (Continued)

(52) U.S. Cl.
 CPC ........... *H04R 19/04* (2013.01); *B81B 3/0021* (2013.01); *H04R 1/028* (2013.01); *H04R 7/04* (2013.01);
 (Continued)

(58) Field of Classification Search
 CPC .......... H04R 19/04; H04R 1/028; H04R 7/04; H04R 7/18; H04R 19/005;
 (Continued)

(56) References Cited

U.S. PATENT DOCUMENTS

| 10,544,038 | B2 * | 1/2020 | Park | ..................... B81C 1/00182 |
| 2003/0133588 | A1 * | 7/2003 | Pedersen | .............. H04R 19/005 |
| | | | | 381/396 |

(Continued)

FOREIGN PATENT DOCUMENTS

| CN | 206341349 U1 | 7/2017 |
| CN | 107809717 A | 3/2018 |

(Continued)

*Primary Examiner* — Oyesola C Ojo
(74) *Attorney, Agent, or Firm* — Baker Botts LLP

(57) ABSTRACT

A MEMS microphone, a microphone unit and an electronic device are disclosed by the present disclosure. The micro-electro-mechanical system microphone comprises: a substrate; a back electrode plate comprising a supporting structure; and a diaphragm located between the substrate and the back electrode plate, wherein the supporting structure comprises a supporting portion used for supporting a periphery of a diaphragm, and a supporting electrode being insulated from the supported diaphragm, and wherein the diaphragm is a stress-free film when being applied no bias, and when being applied a bias, the supporting electrode constrains the periphery of the diaphragm on the supporting portion through electrostatic interaction so as to support the diaphragm in a clamped manner.

10 Claims, 3 Drawing Sheets

(51) Int. Cl.
  *H04R 1/02*          (2006.01)
  *H04R 7/04*          (2006.01)
  *H04R 7/18*          (2006.01)
  *H04R 19/00*         (2006.01)

(52) U.S. Cl.
  CPC ............. *H04R 7/18* (2013.01); *H04R 19/005*
       (2013.01); *B81B 2201/0257* (2013.01); *B81B*
            *2203/0127* (2013.01); *B81B 2203/0307*
          (2013.01); *B81B 2203/04* (2013.01); *B81B*
             *2207/012* (2013.01); *H04R 2201/003*
               (2013.01); *H04R 2499/11* (2013.01)

(58) Field of Classification Search
  CPC .......... H04R 2201/003; H04R 2499/11; H04R
          2410/03; B81B 3/0021; B81B 2201/0257;
                B81B 2203/0127; B81B 2203/0307;
                B81B 2203/04; B81B 2207/012; B81B
                                          7/02
  See application file for complete search history.

(56)                References Cited

U.S. PATENT DOCUMENTS

2009/0278217  A1*  11/2009  Laming ................. B81C 99/004
                                                       257/419
2017/0013363  A1*   1/2017  Berger ................... H04R 19/04
2018/0262844  A1*   9/2018  Barzen ................. B81B 3/0051
2019/0110126  A1*   4/2019  Cargill ................... H04R 1/342

FOREIGN PATENT DOCUMENTS

CN          113613151  A     11/2021
WO     WO 2013/005486  A1     1/2013

* cited by examiner

MICRO-ELECTRO-MECHANICAL SYSTEM MICROPHONE, MICROPHONE UNIT AND ELECTRONIC DEVICE

CROSS-REFERENCE TO RELATED APPLICATIONS

The present disclosure is a National Stage of International Application No. PCT/CN2022/108092, filed on Jul. 27, 2022, which claims priority to a Chinese patent application No. CN 202110875302.3 filed on Jul. 30, 2021 and entitled "MICRO-ELECTRO-MECHANICAL SYSTEM MICRO-PHONE, MICROPHONE UNIT AND ELECTRONIC DEVICE", both of which are hereby incorporated by reference in their entireties.

TECHNICAL FIELD

Embodiments of the present disclosure relates to the field of micro-electro-mechanical system (MEMS) microphone, and particularly to a MEMS microphone, a microphone unit and an electronic device.

BACKGROUND

In the MEMS microphone, a stress-free film may be used as a diaphragm. Stress is an important uncertainty in the manufacturing process of the MEMS microphone. The stress-free film may eliminate this uncertainty, thereby improving the yield and/or manufacturing consistency of the MEMS microphone.

FIG. 1 shows a schematic illustration of a MEMS microphone using a stress-free film as a diaphragm. As shown in FIG. 1, the MEMS microphone comprises a back electrode plate 1 and a diaphragm 2. A back electrode 3 is provided in the back electrode plate 1. A supporting bulge 4 is provided at the periphery of the back electrode plate. The supporting bulge 4 supports the diaphragm 2. The diaphragm 2 is a stress-free film. The diaphragm 2 is supported on the supporting bulge 4 in a simply supported manner. Therefore, stress generated during the manufacturing process does not accumulate in diaphragm 2.

FIG. 2 shows that the diaphragm 2 bends under application of a bias voltage and that a dashed line 5 deviates from the initial position shown. As shown in FIG. 2, since the diaphragm 2, which is a stress-free film, is not fixed with the periphery thereof to the supporting bulge 4, the diaphragm 2 is limited on both the size and thickness thereof. Besides, an acoustic property of the stress-free film is also limited compared to the diaphragm with a fixed periphery.

SUMMARY

An objective of the present disclosure is to provide a new technical solution for a MEMS microphone.

According to a first aspect of the present disclosure, a MEMS microphone is provided, comprising: a substrate: a back electrode plate comprising a supporting structure; and a diaphragm located between the substrate and the back electrode plate, wherein the supporting structure comprises a supporting portion used for supporting a periphery of a diaphragm, and a supporting electrode being insulated from the supported diaphragm, and wherein the diaphragm is a stress-free film when being applied no bias, and when being applied a bias, the supporting electrode constrains the periphery of the diaphragm on the supporting portion through electrostatic interaction so as to support the diaphragm in a clamped manner.

According to a second aspect of the present disclosure, a microphone unit is provided, comprising a unit housing, the MEMS microphone described according to embodiments, and an integrated circuit chip, wherein the MEMS microphone and the integrated circuit chip are provided in the unit housing.

According to a third aspect of the present disclosure, an electronic device is provided, comprising the microphone unit described according to embodiments According to embodiments of the present disclosure, the overall performance of the stress-free diaphragm can be improved.

Other features of the present disclosure and advantages thereof will become clear by the following detailed description of exemplary embodiments of the present disclosure with reference to the accompanying drawings.

BRIEF DESCRIPTION OF THE DRAWINGS

The accompanying drawings, which are incorporated in the description and constitute a part of the description, illustrate embodiments of the present disclosure and, together with the description thereof, serve to explain the principles of the present disclosure.

DETAILED DESCRIPTION

Figure 1:
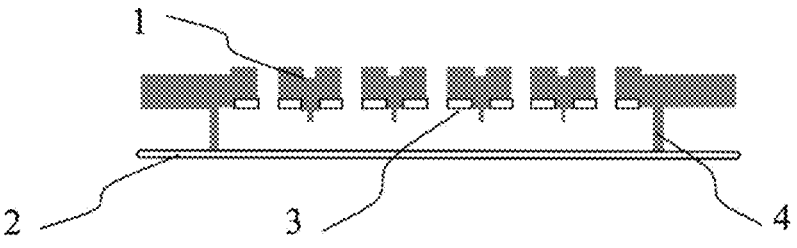
FIG. 1 shows a schematic illustration of a MEMS microphone of the prior art.
Figure 2:
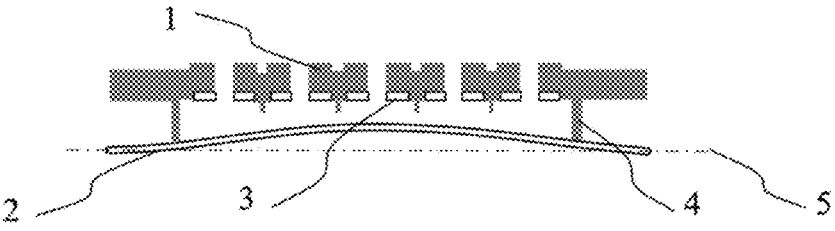
FIG. 2 shows a schematic illustration of a state of the MEMS microphone of FIG. 1 with a bias applied.

Various exemplary embodiments of the present disclosure will now be described in detail with reference to the accompanying drawings. It is to be noted that unless otherwise specified, the scope of present disclosure is not limited to relative arrangements, numerical expressions and values of components and steps as illustrated in the embodiments.

Description to at least one exemplary embodiment is for illustrative purpose only, and in no way implies any restriction on the present disclosure or application or use thereof.

Techniques, methods and devices known to those skilled in the prior art may not be discussed in detail: however, such techniques, methods and devices shall be regarded as part of the description where appropriate.

In all the examples illustrated and discussed herein, any specific value shall be interpreted as illustrative rather than restrictive. Different values may be available for alternative examples of the exemplary embodiments.

It is to be noted that similar reference numbers and alphabetical letters represent similar items in the accompanying drawings. In the case that a certain item is identified in a drawing, further reference thereof may be omitted in the subsequent drawings.

In the manufacturing process of the MEMS microphone, the stress generated in the diaphragm often brings inconsistency to the manufacturing of the diaphragm. Therefore, many people have proposed to use stress-free film as the diaphragm of the MEMS microphone. Compared with the stress film, the stress-free film can provide many excellent properties. For example, the stress-free film may provide high yield and high manufacturing consistency since it can remove the effect of the stress.

At present, however, the application of stress-free film is also subject to some limitations. For example, since the mechanical resonance frequency fr of the stress-free film is proportional to $t/r^2$, the size of the stress-free film is limited in the case of a given thickness (which can be determined by the processing capacity), wherein t is the thickness of the stress-free film and r is the radius of the stress-free film.

In an application requiring a high signal-to-noise ratio SNR, a diaphragm with a large effective area is often the most direct solution to reduce the acoustic noise of the diaphragm-backplane system, wherein the noise power is proportional to the reciprocal of the effective area of the diaphragm.

In this case, one possible way to apply stress-free film involves setting up multiple diaphragm-backplane units in parallel in one chip. This approach significantly increases the size and cost of the microphone chip, while reducing the yield and reliability of the microphone chip.

In the present disclosure, it is proposed to combine the advantages of the stress-free film and the stress film to form the diaphragm. Specifically, the diaphragm is simply supported in a non-operating state, so that no stress accumulates in the diaphragm. For example, the diaphragm is stress-free during manufacturing and/or when being applied no operating bias. This can improve the yield and consistency of the diaphragm in the production process, and can also improve the stability of the diaphragm in the non-working state to a certain extent. In the working state of the diaphragm, the diaphragm is provided in a clamped manner, thus providing various advantages of a stress diaphragm.

Figure 3:
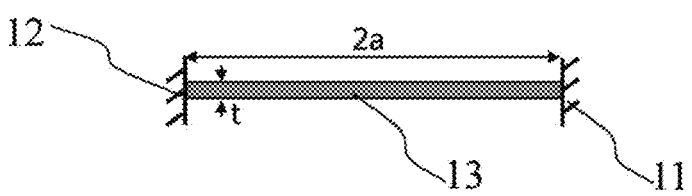
FIG. 3 shows a schematic illustration of a diaphragm provided in a clamped manner.
Figure 4:
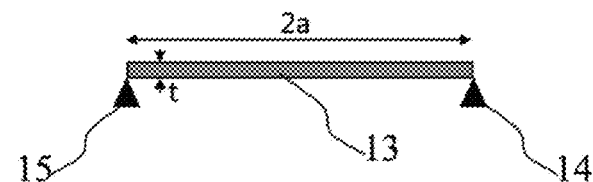
FIG. 4 shows a schematic illustration of a diaphragm provided in a simply supported manner.

FIG. 3 shows a schematic illustration of a diaphragm provided in a clamped manner. FIG. 4 shows a schematic illustration of a diaphragm provided in a simply supported manner. Here, the diaphragm 13 is disc-shaped with a diameter of 2a and a thickness of t. A uniform pressure p is being applied onto the diaphragm 13.

As shown in FIG. 3, the periphery of the diaphragm 13 is constrained to the support bodies 11, 12 in a clamped manner. In the case shown in FIG. 3, the diaphragm 13 has a maximum deflection $Wc=pa^4/64D$ and a first-order natural mechanical resonant frequency $fr=(10.216/2\pi)\cdot(1/a^2)\cdot\sqrt{(D/\rho t)}$.

As shown in FIG. 4, the periphery of the diaphragm 13 is constrained to the support bodies 14, 15 in a clamped manner. In the case shown in FIG. 4, the diaphragm 13 has a maximum deflection $Wc=(5+\upsilon)/(1+\upsilon)\cdot(pa^4/64D)$ and a first-order natural mechanical resonant frequency $fr=(4.935/2\pi)\cdot(1/a^2)\cdot(D/\rho t)$.

Here, $D=Et^3/12(1-\upsilon^2)$, E is the Young's modulus of the diaphragm, v is the Poisson's ratio of the diaphragm, and p is the disc density of the diaphragm.

By comparing the two setting of the diaphragm shown in FIGS. 3 and 4, it can be seen that for a stress-free diaphragm with the same material and thickness, for the same radius, the resonant frequency of the diaphragm provided in the clamped manner is about twice that of the diaphragm provided in the simply supported manner. This means that under the premise of defining the same resonance frequency (related to the MEMS microphone bandwidth), the area of the diaphragm provided in the clamped manner may be up to twice that of the diaphragm provided in the simply supported manner, which can effectively reduce the noise. In addition, the clamped diaphragm with a twice area has a mechanical sensitivity is approximately the same as that of the diaphragm provided in the simply supported manner, which ensures that the sensitivity remains essentially unchanged and therefore increases the signal-to-noise ratio (SNR).

Below, an embodiment of the present disclosure is illustrated with reference to FIGS. 5-8.

Figure 5:
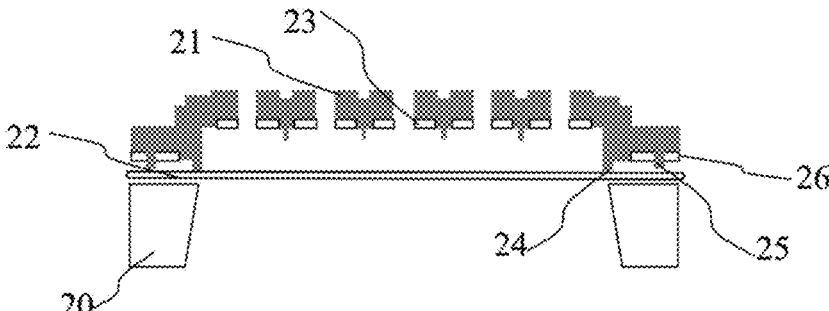
FIG. 5 shows a schematic illustration of a MEMS microphone according to one embodiment.
Figure 6:
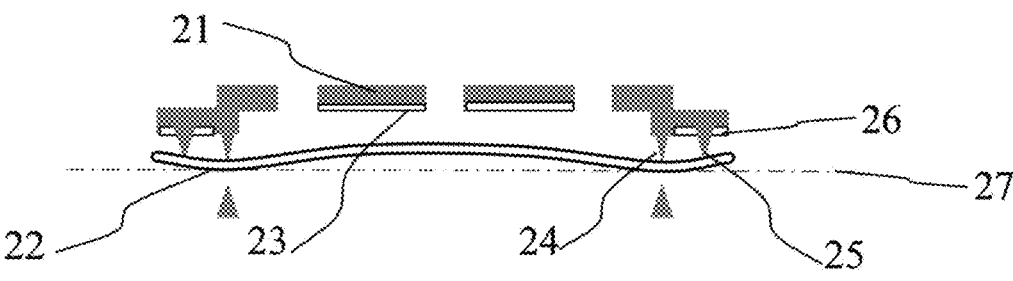
FIG. 6 shows a schematic illustration of a state of the MEMS microphone of FIG. 5 with a bias applied.

FIG. 5 shows a schematic illustration of a MEMS microphone according to one embodiment. FIG. 6 shows a schematic illustration of a state of the MEMS microphone of FIG. 5 with a bias applied.

As shown in FIGS. 5 to 6, the MEMS microphone comprises: a substrate 20; back electrode plates 21, 23 which includes supporting structures 24, 25, 26; and a diaphragm 22 located between the substrate 20 and the back electrode plate 21. The back electrode plate comprises an insulating layer 21 and a back electrode 23. The supporting structure comprises supporting portions 24, 25 and a supporting electrode 26. The supporting portions 24, 25 are used for supporting the periphery of the diaphragm 22, and the supporting electrode 26 is insulated from the supported diaphragm 22.

As shown in FIG. 5, the diaphragm 22 is a stress-free film when being applied no bias. As shown in FIG. 6, when being applied a bias, the supporting electrode 26 constrains the periphery of the diaphragm 22 on the supporting portions 24, 25 through electrostatic interaction so as to make the diaphragm 22 be clamped.

In this way, when being applied no bias, the diaphragm 22 is the stress-free film. Thus, it is possible to improve the yield of the diaphragm during manufacturing and/or improve the reliability of the diaphragm during manufacturing/use. In addition, the stress does not accumulate in the diaphragm during the use of the MEMS microphone.

When being applied a bias, the diaphragm 22 will be fixed in a clamped manner. With the diaphragm 22 provided in this way, it is possible to provide higher performance, e.g., provide improved signal-to-noise ratio, sensitivity, etc.

By constraining the diaphragm in a clamped manner through electrostatic interaction at the periphery of the diaphragm, it is possible to increase the strength of the diaphragm while maintaining the excellent properties of the stress-free film. On the premise of ensuring the same resonant frequency/bandwidth of the diaphragm, it is possible to fabricate a diaphragm-back electrode plate unit with a larger area. This is beneficial to reduce the noise of the MEMS microphone and improve the signal-to-noise ratio (SNR). In addition, this can reduce the total harmonic distortion (THD) of the microphone and/or increase the dynamic range of the microphone, that is, acoustic overload point (AOP).

As shown in FIG. 5, the back electrode plate may be divided into two regions. A first region is the region corresponding to back electrode 23. A second region is the region corresponding to the supporting ports 24, 25, 26. The gap of the second region distanced from the diaphragm 22 is much smaller than the gap of the first region distanced from the diaphragm 22. A pull-in voltage Vp2 of the second region is much smaller than a pull-in voltage VP1 of the first region, i.e., Vp2<<Vp1. When the first region operates at a normal bias voltage Vbias1, the bias voltage Vbias2 of the second region is larger than Vp2, which ensures that the diaphragm is steadily clamped at the supporting portion. Here, Vbias2 may be equal to Vbias1 (they share a common bias provided by a charge pump), thus reducing the complexity of the circuit of the MEMS microphone.

By designing the MEMS microphone in this way, it is possible to allow a larger area of stress-free film without significantly increasing the "useless" chip area and processing difficulty, and without sacrificing the frequency bandwidth, which is beneficial for reducing noise and improving the signal-to-noise ratio (SNR).

As shown in FIGS. 5-6, the supporting portion comprises a plurality of supporting bulges 24, 25. When being applied a bias, the supporting bulges 24, 25 support the diaphragm 22. The supporting electrode 26 is located in the gap between the supporting bulges 24, 25. The supporting bulges 24, 25 project relative to the supporting electrode 26. In this way, it is ensured that the diaphragm 22 does not contact the supporting electrode 26, thereby preventing the supporting electrode from short-circuiting with the diaphragm.

As shown in FIG. 5, a protruding height of the supporting bulges 24, 25 gradually decreases from a center of the diaphragm to a periphery of the same. For example, the projecting height of the supporting bulges 25 is less than the projecting height of the supporting bulges 24. In this way, when being applied an operating bias, the supporting bulges 24 provide a supporting force for the diaphragm 22 to be cocked outwardly away from the back electrode plate 21, which is beneficial in preventing the diaphragm from adhering to the back electrode plate, thereby improving performance of the micro-electro-mechanical system microphone.

In one embodiment, a size of the gap between the supporting bulges 24, 25 gradually decreases from a center of the diaphragm to a periphery of the same. In this way, it is possible to make the diaphragm to be clamped securely.

In another embodiment, an insulating layer may be coated on the supporting electrode 26, to avoid accidental short-circuiting of the supporting electrode 26 with the diaphragm 22.

Figure 7:
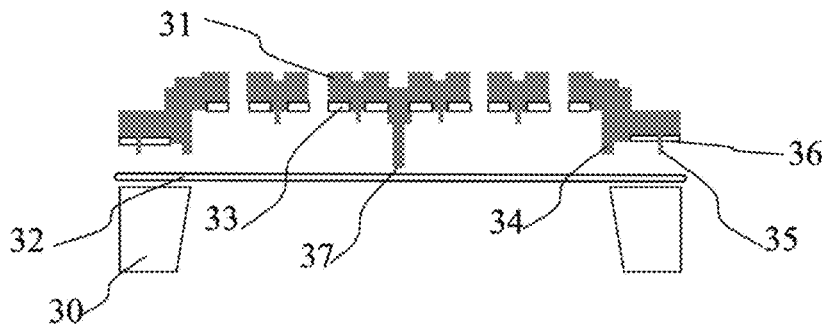
FIG. 7 shows a schematic illustration of a MEMS microphone according to another embodiment.
Figure 8:
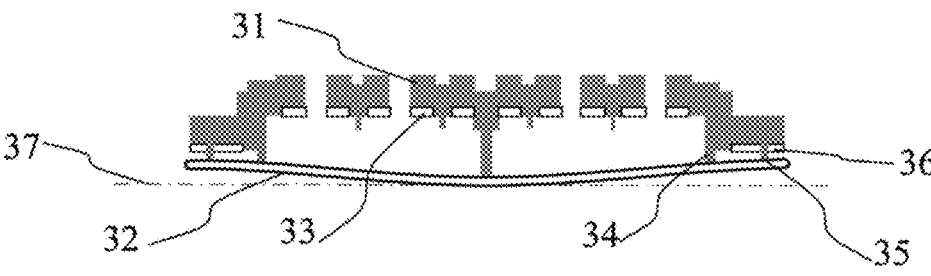
FIG. 8 shows a schematic illustration of a state of the MEMS microphone of FIG. 7 with a bias applied.

FIG. 7 shows a schematic illustration of a MEMS microphone according to another embodiment. FIG. 8 shows a schematic illustration of a state of the MEMS microphone of FIG. 7 with a bias applied. In the embodiments shown in FIGS. 7-8, the MEMS microphone comprises a substrate 30, back electrode plates 31, 33, and a diaphragm 32. The back electrode plate comprises an insulating layer 31 and a back electrode 33. A supporting portion is provided at the periphery of the electrode plate. The supporting portion comprises supporting bulges 34, 35, and a supporting electrode 36. As mentioned earlier, when being applied an operating bias, the supporting portion supports the diaphragm 32.

In the embodiments of FIGS. 7 and 8, the back electrode plate comprises a supporting pillar 37 located in the center of the diaphragm 32. A protruding height of the supporting pillar 37 is greater than that of the supporting portion. In this way, when being applied an operating bias, the supporting pillar 37 supports the diaphragm 32 in the center thereof, and the supporting portions 34, 35, 36 constrain the periphery of the diaphragm 32 so as to tighten the diaphragm 32, which is beneficial to improve the strength of the diaphragm and allow the design of diaphragm with a larger area, thereby further improving the signal-to-noise ratio (SNR) and acoustic overload point (AOP) of the microphone. For example, the protruding height of the supporting pillar 37 is such that, the diaphragm 32 has a deflection greater than or equal to ½ of the thickness of the diaphragm when being applied a bias.

Figure 9:
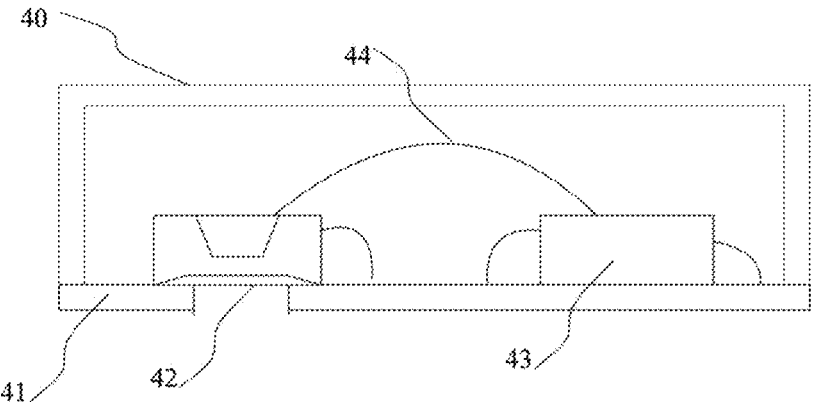
FIG. 9 is a schematic illustration of a microphone unit according to one embodiment of the present disclosure.

FIG. 9 shows a schematic illustration of a microphone unit according to one embodiment disclosed herein.

As shown in FIG. 9, the microphone unit 40 comprises a unit housing 41, the MEMS microphone 42 described above, and an integrated circuit chip 43. The MEMS microphone 42 and the integrated circuit chip 43 are provided in the unit housing 41. The MEMS microphone 42 corresponds to the air inlet of unit housing 41. The MEMS microphone 42, the integrated circuit chip 43 and the circuitry in the unit housing 41 are connected via leads 44.

Figure 10:
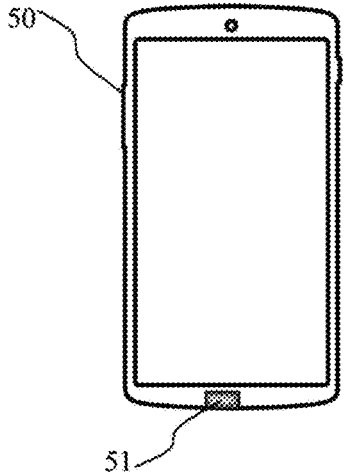
FIG. 10 is a schematic illustration of an electronic device according to one embodiment of the present disclosure.

FIG. 10 shows a schematic illustration of an electronic device according to an embodiment of the present disclosure.

As shown in FIG. 10, the electronic device 50 may include the microphone unit 51 shown in FIG. 9. The electronic device 50 may be a cellular phone, a tablet, a wearable device, and the like.

Although some particular embodiments of the present disclosure have been described in detail by way of examples, it should be understood by those skilled in the art that the above examples are for illustrative purposes only and are not intended to limit the scope of the present disclosure.

The invention claimed is:

1. A MEMS microphone, comprising:
a substrate;
a back electrode plate divided into a center region and an edge region, the edge region comprising a supporting structure; and
a diaphragm located between the substrate and the back electrode plate,
wherein the supporting structure comprises a supporting portion for supporting a periphery of a diaphragm, and a supporting electrode insulated from the supported diaphragm, and the supporting portion comprises a plurality of supporting bulges arranged from an inner side to an outer side in the edge region, and
wherein the diaphragm is configured as a stress-free film when no bias is applied, and
when a bias is applied, a center and the periphery of the diaphragm are both displaced toward the back electrode plate, so that the plurality of supporting bulges support the periphery of the diaphragm, and the supporting electrode is configured to constrain the periphery of the diaphragm on the supporting portion through an electrostatic interaction to support the diaphragm in a clamped manner.

2. The MEMS microphone according to claim 1, wherein the supporting electrode is located in a gap between the supporting bulges, and the supporting bulges protrude relative to the supporting electrode.

3. The MEMS microphone according to claim 1, wherein a protruding height of the supporting bulges gradually decreases from a center of the diaphragm to a periphery of the same.

4. The MEMS microphone according to claim 2, wherein a size of the gap between the supporting bulges gradually decreases from a center of the diaphragm to a periphery thereof.

5. The MEMS microphone according to claim 1, wherein an insulating layer is coated on the supporting electrode.

6. The MEMS microphone according to claim 1, wherein the back electrode plate comprises a supporting pillar having a height and located in the center of the diaphragm, and a protruding height of the supporting pillar is greater than the height of the supporting portion.

7. The MEMS microphone according to claim 6, wherein the protruding height of the supporting pillar is such that, the diaphragm has a deflection greater than or equal to ½ of the thickness of the diaphragm when the bias is applied.

8. A microphone unit comprising:

a unit housing;

a MEMS microphone according to claim 1; and an integrated circuit chip, wherein the MEMS microphone and the integrated circuit chip are provided in the unit housing.

9. An electronic device comprising a microphone unit according to claim 8.

10. The MEMS microphone according to claim 1, wherein the center region of the back electrode plate is configured to protrude away from the diaphragm relative to the edge region, so that a first gap of the center region distanced from the diaphragm is larger than a second gap of the edge region distanced from the diaphragm.

\* \* \* \* \*